(12) United States Patent
Carrere et al.

(10) Patent No.: US 9,224,775 B2
(45) Date of Patent: Dec. 29, 2015

(54) BACK SIDE ILLUMINATION IMAGE SENSOR WITH LOW DARK CURRENT

(71) Applicants: STMicroelectronics (Crolles 2) SAS, Crolles (FR); Commissariat A L'Energie Atomique et aux Energies Alternatives, Paris (FR)

(72) Inventors: Jean-Pierre Carrere, Grenoble (FR); Patrick Gros D'Aillon, Biviers (FR); Stephane Allegret-Maret, Grenoble (FR); Jean-Pierre Oddou, Champagnier (FR)

(73) Assignees: STMicroelectronics (Crolles 2) SAS, Crolles (FR); Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/446,804

(22) Filed: Jul. 30, 2014

(65) Prior Publication Data
US 2015/0035106 A1 Feb. 5, 2015

(30) Foreign Application Priority Data
Aug. 1, 2013 (FR) ................. 13 57669

(51) Int. Cl.
*H01L 27/14* (2006.01)
*H01L 27/146* (2006.01)

(52) U.S. Cl.
CPC ...... *H01L 27/14625* (2013.01); *H01L 27/1462* (2013.01); *H01L 27/1464* (2013.01); *H01L 27/14645* (2013.01); *H01L 27/14685* (2013.01)

(58) Field of Classification Search
CPC ............ H01L 27/146; H01L 27/14685; H01L 27/14625
See application file for complete search history.

(56) References Cited

U.S. PATENT DOCUMENTS

| | | | |
|---|---|---|---|
| 2006/0131627 A1* | 6/2006 | Kondo et al. | 257/295 |
| 2008/0054386 A1* | 3/2008 | Akram | 257/432 |
| 2008/0206983 A1* | 8/2008 | Sawayama et al. | 438/627 |
| 2008/0303416 A1* | 12/2008 | Fery et al. | 313/504 |
| 2010/0078744 A1* | 4/2010 | Wano et al. | 257/432 |
| 2010/0301444 A1* | 12/2010 | Koike | 257/443 |
| 2011/0018079 A1 | 1/2011 | Pain | |
| 2011/0175187 A1* | 7/2011 | Ueno et al. | 257/437 |

OTHER PUBLICATIONS

INPI Search Report and Written Opinion for FR 1357669 mailed Jan. 21, 2014 (7 pages).

* cited by examiner

*Primary Examiner* — Nathan Ha
(74) *Attorney, Agent, or Firm* — Gardere Wynne Sewell LLP

(57) ABSTRACT

An integrated circuit includes a back side illuminated image sensor formed by a substrate supporting at least one pixel, an interconnect part situated above a front side of the substrate and an anti-reflective layer situated above a back side of the substrate. The anti-reflective layer may be formed of a silicon nitride layer. An additional layer is situated above the anti-reflective layer. The additional layer is formed of one of amorphous silicon nitride or hydrogenated amorphous silicon nitride, in which the ratio of the number of silicon atoms per cubic centimeter to the number of nitrogen atoms per cubic centimeter is greater than 0.7.

20 Claims, 3 Drawing Sheets

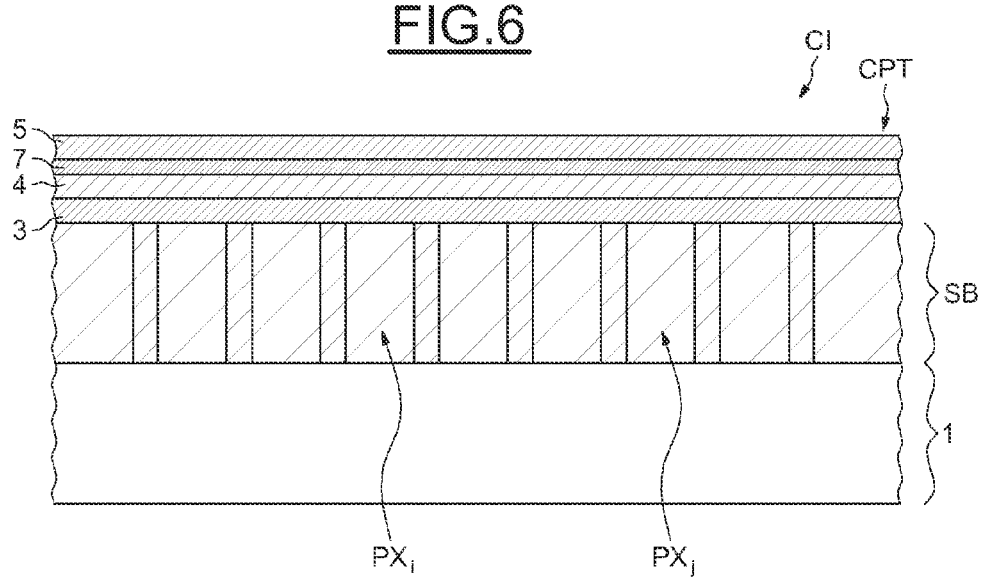
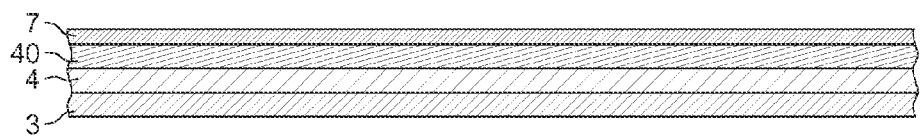

BACK SIDE ILLUMINATION IMAGE SENSOR WITH LOW DARK CURRENT

PRIORITY CLAIM

This application claims priority from French Application for Patent No. 1357669 filed Aug. 1, 2013, the disclosure of which is incorporated by reference.

TECHNICAL FIELD

The invention relates to integrated circuits, and more particularly to image sensors produced using CMOS technology, with back side illumination, commonly named BSI CMOS image sensors (back side illumination CMOS image sensors) by those skilled in the art.

BACKGROUND

FIG. 1 illustrates schematically a pixel $PX_i$ of the pixel matrix of one such back side illumination image sensor CPT.

More precisely, the pixel $PX_i$ is produced in a semiconductor substrate SB, for example made of $p^-$-doped p-type silicon. The photosensitive region of the pixel is delimited by lateral insulation regions RIS. For example, these lateral insulations can be made up of trenches of silicon oxide, or else by more heavily p-doped regions. The photosensitive region itself includes domains of n-, $p^-$- and $p^+$-type conductivity ($p^+$ signifying a heavier doping than p). These doping regions are arranged in the aim of forming a photodiode, for example of n-i-p type, serving to capture, then store the photogenerated charges. The peripheral doping regions serve to create an electric field gradient, to better drain the photogenerated charges towards the photodiode.

Above the front side FAV of the substrate, the integrated circuit conventionally includes a first part 1, commonly named FEOL (front end of line) by those skilled in the art, including the components of the integrated circuit such as transistors. In this respect, the pixel $PX_i$ includes the transfer gate TG of a transfer transistor in this part 1.

Part 1 of the integrated circuit CI is conventionally overlaid by an interconnect part 2, commonly named BEOL (back end of line) by those skilled in the art, notably including various metallization levels intended to mutually interconnect the various components of the integrated circuit and with connection pads situated on the front side of this assembly.

Above the back side FAR of the substrate is found a stack of layers including a first layer 3, made of silicon dioxide, overlaid by an anti-reflective layer of silicon nitride $Si_3N_4$ itself overlaid by another layer 5 of silicon dioxide. This layer 5 is itself supported by a part 6 notably including colored filters as well as back side contact pads.

The sensor CPT is a back side illumination sensor because the rays of light penetrate the pixel $PX_i$ via the back side FAR of the substrate.

The silicon nitride layer 4 is an optical anti-reflection layer, the aim of which is notably to effect an adaptation of the optical index between the outside environment and the photodiode in such a way as to avoid reflection of the rays of light coming from the outside environment.

In theory, when the sensor is not illuminated, the photodiode does not produce any current and the resulting image is perfectly black. In practice, there is always a slight dark current that attempts are made to minimize. And such a back side image sensor exhibits dark current degradation.

The degradation comes from plasma-based treatments used during the treatments of the back side of the sensor, particularly for forming the back side metallic contact pads, of aluminum for example, and for forming the layer protecting the colored filters, which aims to protect these filters during the slicing of the sensors along the slicing lines of the semiconductor wafer.

More precisely, the plasma charges the silicon oxide-silicon nitride stack triggering a trapping of positive charges (holes) in the anti-reflective silicon nitride layer, holes which will then migrate to the interface with the substrate to create a dark current by recombination with electrons.

SUMMARY

According to one embodiment, a back side illumination image sensor is provided having a reduced illumination current with respect to a sensor of the prior art.

By forming a conductive layer, silicon-rich for example, above the anti-reflective layer and before the back side treatments involving plasma, it is possible to reduce the dark current.

According to one aspect, an integrated circuit is thus provided comprising a back side illumination image sensor, including a substrate possessing a region incorporating at least one pixel, and generally a pixel matrix, an interconnect part situated above a front side of the substrate, and at least one anti-reflective layer situated above a back side of said substrate region.

According to a general characterizing feature of this aspect, the anti-reflective layer is a layer including silicon nitride and the sensor furthermore comprises an additional layer situated above the anti-reflective layer and including at least a lower part containing hydrogenated amorphous silicon (a-Si:H) or hydrogenated amorphous silicon nitride (a-SiN$_x$: H), in which the Si/N ratio of the number of silicon atoms per cubic centimeter to the number of nitrogen atoms per cubic centimeter is greater than 0.7, and preferably greater than or equal to 1.2.

The function of this additional layer is to absorb, or even to stop, ultraviolet radiation, and/or to evacuate the trapped charges in the anti-reflective layer during subsequent plasma treatments, which will therefore reduce the residual positive charges possibly trapped in the anti-reflective layer and consequently reduce the dark current.

By way of example, the lower part of the additional layer can comprise about 41% of silicon atoms and 33% of nitrogen atoms.

The thickness of this lower part of the additional layer is preferably less than a few tens of nanometers, for example a hundred nanometers, or even less than ten nanometers.

This lower part of the additional layer can be in contact with the anti-reflective layer or else separated from this anti-reflective layer by a layer of amorphous silicon oxide (a-SiO$_x$). This being the case, the presence of silicon oxide could incur a loss of optical transmission.

Although it is possible that all, and not only the lower part, of the additional layer, contains hydrogenated amorphous silicon nitride in which the ratio of the number of silicon atoms per cubic centimeter to the number of nitrogen atoms per cubic centimeter is greater than 0.7, this additional layer can in practice possess an upper part containing standard amorphous silicon nitride, i.e. amorphous silicon nitride in which the ratio of the number of silicon atoms per cubic centimeter to the number of nitrogen atoms per cubic centimeter is in the order of or less than 0.7, to limit the absorption of the light by the additional layer. This makes it possible to ensure the integrity of the silicon-rich layer when the latter is in the order of a few nanometers.

This being the case, the thickness of the additional layer is preferably less than 100 nanometers so as not to disturb the optical transmission of the anti-reflective layer.

In practice, an additional layer of a thickness preferably below 20 nanometers will be chosen.

According to another aspect a process for forming a back side illumination image sensor is provided, comprising a formation above a back side of a substrate of an anti-reflective layer, and additional plasma-based treatments carried out subsequently to the formation of said anti-reflective layer.

According to a general characterizing feature of this other aspect, the process furthermore comprises subsequently to the formation of the anti-reflective layer containing silicon nitride, and prior to said plasma-based treatments, a formation of an additional layer situated above the anti-reflective layer and including at least a lower part containing hydrogenated amorphous silicon nitride in which the ratio of the number of silicon atoms per cubic centimeter to the number of nitrogen atoms per cubic centimeter is greater than 0.7.

BRIEF DESCRIPTION OF THE DRAWINGS

Other advantages and characterizing features of the invention will appear on examining the detailed description of embodiments, in no way limiting, and the appended drawings in which:

FIGS. 2 to 7 illustrate various methods of implementation and embodiments according to the invention.

DETAILED DESCRIPTION OF THE DRAWINGS

Figure 2:
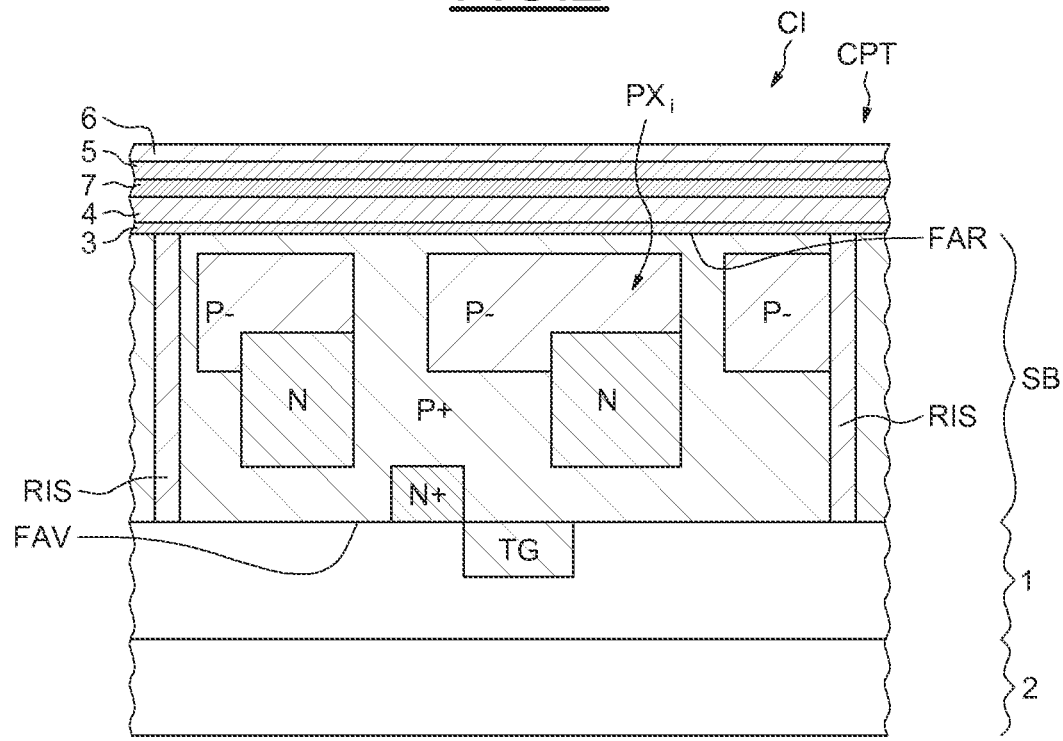

In FIG. 2, the reference CPT denotes a back side illumination image sensor produced in an integrated circuit CI.

In FIG. 2, for simplification purposes only one pixel $PX_i$ of the pixel matrix of the sensor CPT is shown.

Figure 1:
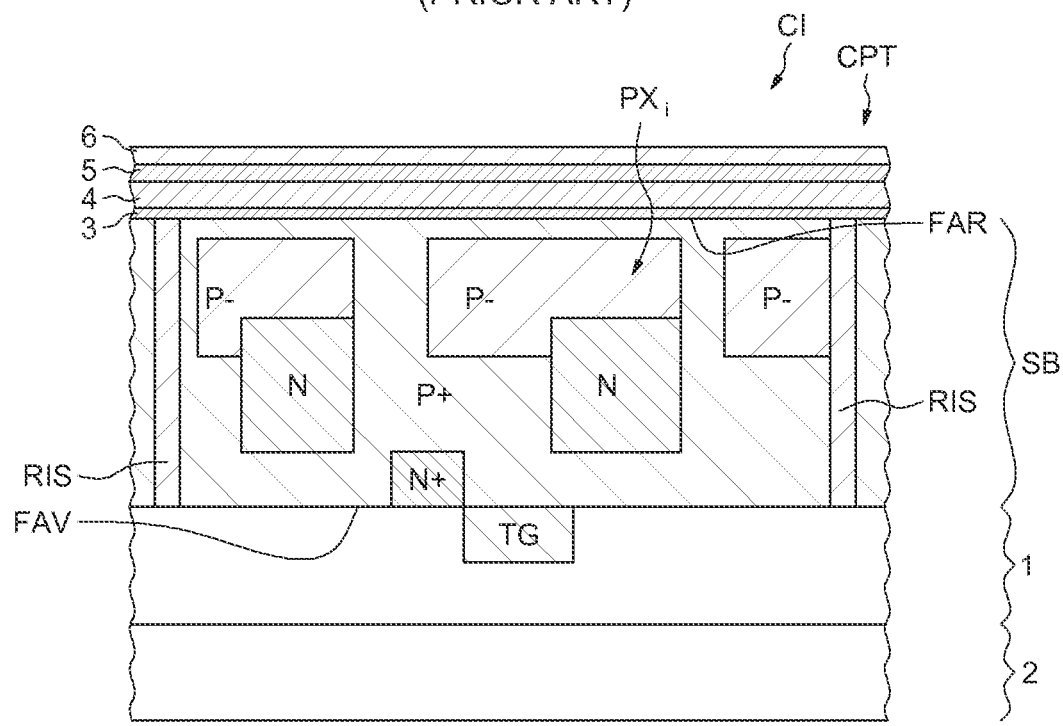
FIG. 1, already described, illustrates schematically and partially a back side illumination image sensor of the prior art.
Figure 3:
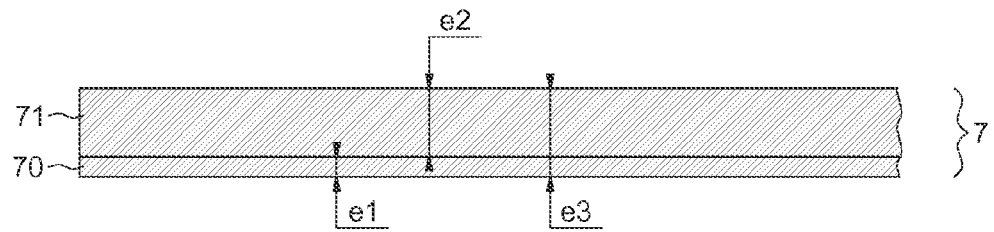

In comparison to FIG. 1, the sensor CPT in FIG. 2 includes above the silicon nitride anti-reflective layer 4, an additional layer 7 having, as illustrated in FIG. 3, a lower part 70 containing hydrogenated amorphous silicon nitride in which the ratio r of the number of silicon atoms Si per cubic centimeter to the number of nitrogen atoms N per cubic centimeter is greater than 0.7 (Si/N>07).

Preferably, this ratio r can be greater than or equal to 1.2.

Indeed with a ratio greater than or equal to 1.2, a gain in performance of about 15% is obtained with respect to a ratio which may be only slightly greater than 0.7.

The additional layer 7 evacuates the charge more effectively than the anti-reflective layer 4 because it is richer in silicon atoms.

It should be noted here that this layer 7 could be formed solely from hydrogenated amorphous silicon, the ratio r then being infinite.

By way of example, the lower part 70 of the additional layer can comprise about 41% silicon atoms and 33% nitrogen atoms. The stoichiometry of the lower part 70 can however vary as a function of its thickness.

This being the case, this lower part 70 also includes hydrogen atoms, for example greater than 17%, by reason of the nature of the deposition precursors used in the formation of the layer 7. The hydrogen plays a dominant role in the passivation of the dangling bonds at the $Si/SiO_2$ interfaces, these dangling bonds potentially constituting electrically active defects.

Generally, the thickness of the layer 7 is less than 100 nanometers so that the silicon nitride stack formed by the anti-reflective layer 4 and the additional layer 7 has a thickness compatible with the anti-reflective character and the optical index adapting character desired.

In practice, the thickness e3 of the layer 7 (FIG. 3) can be in the order of 3 to 20 nanometers.

Although it is possible to produce the layer 7 solely from the chemical elements Si, N and H with a Si/N ratio greater than 0.7, for example 1.2, for reducing the dark current it turns out to be enough to have a thickness of silicon-enriched hydrogenated amorphous silicon nitride of less than ten nanometers or even in the order of a few nanometers.

If a thickness e1 in the order of a few nanometers, for example 2 or 3 nanometers, is desired for the lower part 70 of the silicon-enriched layer 7, it is preferable, particularly for reasons of integrity, to supplement the lower part 70 by an upper part 71 made of standard amorphous silicon nitride, i.e. having a Si/N ratio of atoms in the order of 0.7 or even less, to avoid reducing the transmission of light.

The thickness e2 of the upper part 71 can thus be in the order of ten nanometers.

Figure 4:
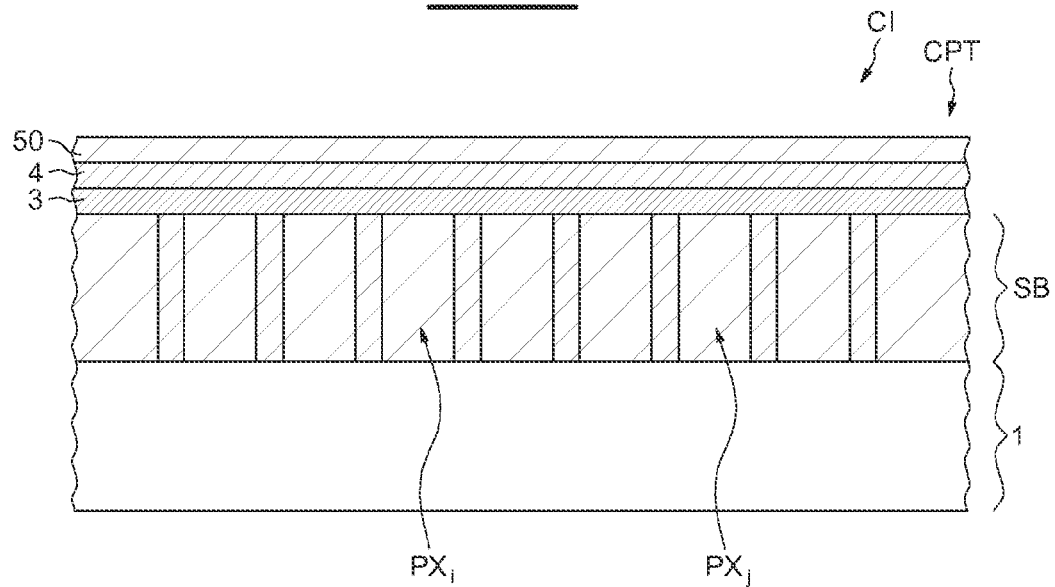

We will now describe, referring more particularly to FIG. 4 and onwards, the methods of implementation of a process for treating the back side of the substrate SB.

First of all, in a conventional manner known per se, the various photodiodes of the pixels $PX_i$, $PX_j$ (FIG. 4) are produced in the substrate SB. Then the front side treatments of this substrate are produced, notably including the production of part 1 (FEOL) then of part 2 (BEOL) which has not been shown for the purposes of simplification in FIG. 4 and onwards.

Once these treatments have been carried out, a maintenance substrate, which acts as handle and which makes it possible to turn over the wafer on which the various sensors are produced, is bonded onto the front side of the resulting assembly.

From this point, two options are possible.

Either the original substrate is a substrate of silicon on insulator (SOI) type, i.e. including the substrate SB above a buried insulating region (generally known by those skilled in the art by the acronym BOX: buried oxide) itself situated above a carrier substrate, or the initial substrate SB is a bulk substrate.

In the first case, (silicon on insulator (SOI) substrate), the buried insulating region (BOX) can already comprise the stack of a silicon dioxide layer 3 overlaid by the anti-reflective layer 4 overlaid by another silicon dioxide layer 50. And, in this case, the carrier substrate is withdrawn, for example by grinding, so as to obtain the structure illustrated in FIG. 4.

In the other configuration (bulk substrate) the substrate is thinned up to the regions containing the photodiodes then the stack of layers 3, 4 and 50 is formed in a conventional manner known per se.

For information purposes, the thickness of the layer 3 is in the order of a few nanometers while the thickness of the anti-reflective layer 4 is in the order of a few tens of nanometers and the thickness of the layer 50 is in the order of a few nanometers.

Figure 5:
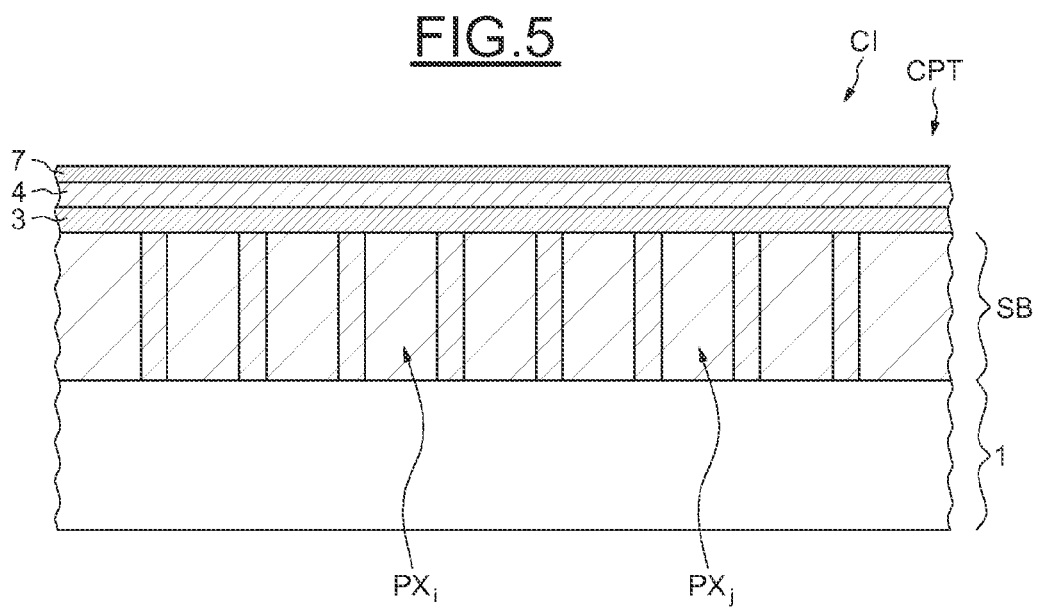

After withdrawal of the layer 50 follows (FIG. 5) the formation of the additional layer 7, for example by a plasma-enhanced chemical vapor deposition process (PECVD deposition). For information purposes, for a PECVD deposition, to deposit the lower part 70 of the layer 7 the quantities of silane and ammonia ($NH_3$) are adjusted so as to obtain a ratio of the volume rates of silane to ammonia greater than 4 by limiting the power of the high-frequency generator during this step in such a way as to obtain the desired atomic content ratio of the silicon Si to the nitrogen N. Then, when this lower part 70 is formed, it will be possible to increase the power of the high-frequency generator so as to form the upper part 71 of the layer 7 and obtain conventional amorphous silicon nitride.

Those skilled in the art will know how to adjust the deposition conditions (temperature, pressure etc.) as a function of the type of deposition chamber used and of the desired Si/N ratio.

The use of ammonia and the silane precursor gas in this plasma-assisted deposition is the reason why hydrogen atoms are found in the layer 7.

It should be noted that in this embodiment, the lower part 70 of the layer 7 is in contact with the anti-reflective layer 4.

It is then preferable, though not indispensable, to form a protective layer 5, of silicon dioxide for example, above the layer 7. This protective layer 5 can be formed by deposition.

The subsequent steps of the process for fabricating the sensor are conventional and known per se and include plasma treatments in particular. Thanks to the presence of the additional layer 7, the trapping of positive charge in the anti-reflective layer 4 will be limited, or even suppressed.

It would be possible, in a variant as illustrated in FIG. 7, for the lower part 70 of the additional layer 7 to not be directly in contact with the anti-reflective layer 4. In this way, it is possible to provide a silicon dioxide layer 40 between the anti-reflective layer 4 and the additional layer 7.

By way of example, with an additional silicon-enriched layer, the lower part of which includes for example 41% of silicon, 33% of nitrogen and 26% of hydrogen, it is possible to obtain a reduction in the dark current of about 50%.

What is claimed is:

1. An integrated circuit, comprising:
a back side illuminated image sensor including: a substrate possessing a region incorporating at least one pixel, an interconnect part situated above a front side of the substrate, and at least one anti-reflective layer situated above a back side of said substrate region;
wherein the anti-reflective layer is a layer including silicon nitride, and
an additional layer situated above the anti-reflective layer and including at least a lower part containing one of hydrogenated amorphous silicon or hydrogenated amorphous silicon nitride, in which a ratio of the number of silicon atoms per cubic centimeter to the number of nitrogen atoms per cubic centimeter is greater than 0.7.

2. The integrated circuit according to claim 1, wherein said ratio is greater than or equal to 1.2.

3. The integrated circuit according to claim 1, wherein said lower part of the additional layer comprises about 41% of silicon atoms and 33% of nitrogen atoms.

4. The integrated circuit according to claim 1, wherein a thickness of said lower part of the additional layer is less than a hundred nanometers.

5. The integrated circuit according to claim 4, wherein the thickness of said lower part of the additional layer is less than ten nanometers.

6. The integrated circuit according to claim 1, wherein said lower part of the additional layer is in contact with said anti-reflective layer.

7. The integrated circuit according to claim 1, wherein said lower part of the additional layer is separated from said anti-reflective layer by a layer of silicon oxide.

8. The integrated circuit according to claim 1, wherein said additional layer comprises an upper part containing amorphous silicon nitride in which a ratio of the number of silicon atoms per cubic centimeter to the number of nitrogen atoms per cubic centimeter is in the order of 0.7.

9. The integrated circuit according to claim 1, wherein a thickness of the additional layer is less than 100 nm.

10. The integrated circuit according to claim 9, wherein the thickness of the additional layer is less than 20 nm.

11. The integrated circuit according to claim 1, further comprising a protective layer above said additional layer.

12. The integrated circuit according to claim 1, wherein said region incorporates several pixels.

13. A process for forming a back side illumination image sensor, comprising:
forming an anti-reflective layer above a back side of a substrate;
carrying out additional plasma-based treatments subsequent to the formation of said anti-reflective layer;
subsequent to the formation of the anti-reflective layer containing silicon nitride and prior to carrying out said plasma-based treatments, forming an additional layer situated above the anti-reflective layer and including at least a lower part containing one of hydrogenated amorphous silicon or hydrogenated amorphous silicon nitride in which a ratio of the number of silicon atoms per cubic centimeter to the number of nitrogen atoms per cubic centimeter is greater than 0.7.

14. The process according to claim 13, wherein said ratio is greater than or equal to 1.2.

15. The process according to claim 13, wherein said lower part of the additional layer comprises about 41% of silicon atoms and 33% of nitrogen atoms.

16. An integrated circuit, comprising:
an integrated image sensor having a front side with interconnects and a back side configured to be illuminated;
an anti-reflective layer situated above the back side; and
an additional layer situated above the anti-reflective layer and formed of at least one of hydrogenated amorphous silicon or hydrogenated amorphous silicon nitride;
wherein a ratio of the number of silicon atoms per cubic centimeter to the number of nitrogen atoms per cubic centimeter in said additional layer is greater than 0.7.

17. The integrated circuit of claim 16, wherein the additional layer is in contact with the anti-reflective layer.

18. The integrated circuit of claim 16, wherein the additional layer is formed solely of hydrogenated amorphous silicon.

19. The integrated circuit of claim 16, wherein the additional layer comprises a first layered region formed of hydrogenated amorphous silicon nitride and a second layered region formed of amorphous silicon nitride.

20. The integrated circuit of claim 19, wherein a ratio of the number of silicon atoms per cubic centimeter to the number of nitrogen atoms per cubic centimeter in said second layered region is less than or equal to 0.7.

* * * * *